US007173876B2

(12) United States Patent
Oda

(10) Patent No.: US 7,173,876 B2
(45) Date of Patent: Feb. 6, 2007

(54) SEMICONDUCTOR INTEGRATED CIRCUIT

(75) Inventor: Zenzo Oda, Chino (JP)

(73) Assignee: Seiko Epson Corporation (JP)

( * ) Notice: Subject to any disclaimer, the term of this patent is extended or adjusted under 35 U.S.C. 154(b) by 189 days.

(21) Appl. No.: 10/798,977

(22) Filed: Mar. 11, 2004

(65) Prior Publication Data

US 2004/0228199 A1   Nov. 18, 2004

(30) Foreign Application Priority Data

Mar. 14, 2003 (JP) .............................. 2003-069014
Jul. 1, 2003 (JP) .............................. 2003-189485

(51) Int. Cl.
*G11C 8/00* (2006.01)

(52) U.S. Cl. ................... 365/233; 365/189.01; 345/98; 345/99; 345/100; 345/531

(58) Field of Classification Search ............. 345/98 X, 345/531 X, 99 X, 100 X, 98, 99, 100, 531; 345/98 O; 365/189.01 X, 233 O
See application file for complete search history.

(56) References Cited

U.S. PATENT DOCUMENTS 6,724,378 B2 * 4/2004 Tamura et al. .............. 345/204

6,915,400 B2 * 7/2005 Engelahardt ................ 711/167
6,933,915 B2 * 8/2005 Hidaka et al. ................ 345/98
2002/0186213 A1   12/2002 Koizumi

FOREIGN PATENT DOCUMENTS

JP     2002-014659      1/2002

* cited by examiner

*Primary Examiner*—VanThu Nguyen
(74) *Attorney, Agent, or Firm*—Harness, Dickey & Pierce, P.L.C.

(57) ABSTRACT

A semiconductor integrated circuit is provided, using a one-port memory cell, capable of smoothly performing a data write/read operation in accordance with an instruction from a CPU and a data read operation to display an image on a display panel. The semiconductor integrated circuit includes a memory cell having a port through which data is input to and output from a set of bit lines, a write/read circuit connected with the port via the set of bit lines, a read circuit connected with the port via the set of bit lines, a CPU-system control circuit that controls the write/read circuit so that a data write or read operation based on a write request or read request from a CPU is performed for a first period, and a display-system control circuit that controls the read circuit so that data to be supplied to a display panel is read for a second period which does not overlap the first period.

5 Claims, 15 Drawing Sheets

PERIOD DURING WHICH DATA READ OPERATION BASED ON READ REQUEST FROM LCD IS PROHIBITED

SEMICONDUCTOR INTEGRATED CIRCUIT

RELATED APPLICATIONS

This application claims priority to Japanese Patent Application Nos. 2003-069014 filed Mar. 14, 2003 and 2003-189485 filed Jul. 1, 2003 which are hereby expressly incorporated by reference herein in their entirety.

BACKGROUND

1. Technical Field of the Invention

The present invention generally relates to semiconductor integrated circuits including memory cells for driving display panels such as LCDs (liquid crystal displays) and plasma displays. In particular, the present invention relates to a semiconductor integrated circuit including SRAM (static random access memory) memory cells.

2. Description of the Related Art

LCD drivers of the related art including SRAM memory cells for driving LCDs often use dual-port memory cells to concurrently perform a data write/read operation in accordance with an instruction from a CPU and a data read operation to display images on an LCD.

FIG. 18 shows the structure of such a dual-port memory cell. The memory cell includes inverter circuits INV1 and INV2, n-channel MOS transistors QN1 and QN2, and p-channel MOS transistors QP1 and QP2. The input of the inverter circuit INV1 is connected with a first storage node N1, and the output thereof is connected with a second storage node N2. The input of the inverter circuit INV2 is connected with the second storage node N2, and the output thereof is connected with the first storage node N1. The transistors QN1 and QN2 form a first port (write/read port), and the transistors QP1 and QP2 form a second port (read-only port).

However, such a dual-port memory cell has a problem in that a large number of transistors are required to form a memory cell, resulting in a large semiconductor substrate, and the overall semiconductor integrated circuit is costly.

Japanese Unexamined Patent Application Publication No. 2002-14659 (page 2, FIG. 1) discloses a liquid crystal driving semiconductor device in which an increase in chip size and a reduction in image quality can be prevented as much as possible and a CPU can access a memory as quickly as possible. This liquid crystal driving semiconductor device includes a single-port memory that stores display-data to be displayed on a liquid crystal display section, a liquid crystal driving circuit that retrieves the display-data stored in the single-port memory at predetermined intervals and that sends the display-data to the liquid crystal display section, and a control circuit that controls the liquid crystal driving circuit so that, when a CPU does not access the single-port memory, the display-data is retrieved from the single-port memory to the liquid crystal driving circuit at the predetermined intervals and the retrieved data is sent to the liquid crystal display section, whereas, when the CPU accesses the single-port memory while the liquid crystal driving circuit is retrieving the data from the single-port memory, priority is given to the CPU so that the CPU starts an access operation while the liquid crystal driving circuit stops a display-data retrieval operation, and the liquid crystal driving circuit again starts the display-data retrieval operation immediately after the access operation.

However, there is a problem in that the display-data retrieval operation of the liquid crystal driving circuit must be stopped while the liquid crystal driving circuit is retrieving the data, thus increasing the complexity of the control operation and causing excessive power consumption.

Accordingly, in view of the foregoing points, it is an object of the present invention to provide a semiconductor integrated circuit, using a one-port memory cell, capable of smoothly performing a data write/read operation in accordance with an instruction from a CPU and a data read operation to display an image on a display panel.

SUMMARY

In order to overcome the foregoing problems, a semiconductor integrated circuit according to a first aspect of the present invention includes a memory cell having a port through which data is input to and output from a set of bit lines when a word line is driven, a write/read circuit connected with the port via the set of bit lines for writing data to the memory cell and for reading data from the memory cell, a read circuit connected with the port via the set of bit lines for reading data from the memory cell, a CPU-system control circuit that controls the write/read circuit so that a data write or read operation based on a write request or read request from a CPU is performed for a first period, and a display-system control circuit that controls the read circuit so that data to be supplied to a display panel is read for a second period which does not overlap the first period.

According to the first aspect of the present invention, the CPU-system control circuit controls the write/read circuit so that data is written or read for a first period based on a write request or read request from a CPU, and the display-system control circuit controls the read circuit so that data to be supplied to a display panel is read for a second period which does not overlap the first period, thus allowing a data write/read operation in accordance with an instruction from the CPU and a data read operation to display an image on the display panel to be smoothly performed while a one-port memory cell is used.

The CPU-system control circuit may include a first circuit that activates a write control signal based on a write request signal sent from the CPU, and a second circuit that activates a read control signal based on a read request signal sent from the CPU. The display-system control circuit may include a third circuit that activates a display-data read control signal based on at least the write request signal and read request signal sent from the CPU and a display-data read request signal sent from a timing generator circuit.

Specifically, the third circuit may activate the display-data read control signal based on the display-data read request signal sent from the timing generator circuit when the write request signal and read request signal sent from the CPU are inactive and when the write control signal and read control signal generated by the CPU-system control circuit are inactive.

Alternatively, the third circuit may start activation of the display-data read control signal based on the display-data read request signal sent from the timing generator circuit when the write request signal and read request signal sent from the CPU are inactive and when the write control signal and read control signal generated by the CPU-system control circuit are inactive, and may activate the display-data read control signal when the write control signal and read control signal generated by the CPU-system control circuit are inactive.

Alternatively, the third circuit may start activation of the display-data read control signal based on the display-data read request signal sent from the timing generator circuit for a period except for a period after completion of activation of the write request signal sent from the CPU until completion of activation of the write control signal generated by the CPU-system control circuit and a period after completion of activation of the read request signal sent from the CPU until completion of activation of the read control signal generated by the CPU-system control circuit, and may activate the display-data read control signal for a first period when the write control signal and read control signal generated by the CPU-system control circuit are inactive. The first circuit may start activation of the write control signal when a second period longer than the first period has elapsed after completion of activation of the write request signal sent from the CPU. The second circuit may start activation of the read control signal when a third period longer than the first period has elapsed after completion of activation of the read request signal sent from the CPU.

A semiconductor integrated circuit according to a second aspect of the present invention includes a memory cell array including a plurality of memory cells that store data, a CPU-system control circuit that divides the memory cell array into a plurality of blocks for control so that data is written or read based on a write request or read request from a CPU, and a display-system control circuit that divides the memory cell array into a plurality of blocks for control so that data to be supplied to a display panel is not read from a block where data is being written or read based on a request from the CPU, and that divides the memory cell array into a plurality of blocks for control so that data to be supplied to the display panel is read from a block where data is not being written or read based on a request from the CPU.

According to the second aspect of the present invention, the CPU-system control circuit divides the memory cell array into a plurality of blocks for control so that data is written or read based on a request from a CPU, and the display-system control circuit divides the memory cell array into a plurality of blocks for control so that data to be supplied to a display panel is written only from a block where data is not being written or read based on a request from the CPU, thus allowing a data write/read operation in accordance with an instruction from the CPU and a data read operation to display an image on the display panel to be smoothly performed while a one-port memory cell is used.

In this structure, an SRAM memory cell may be used as the memory cell.

DETAILED DESCRIPTION

Figure 1:
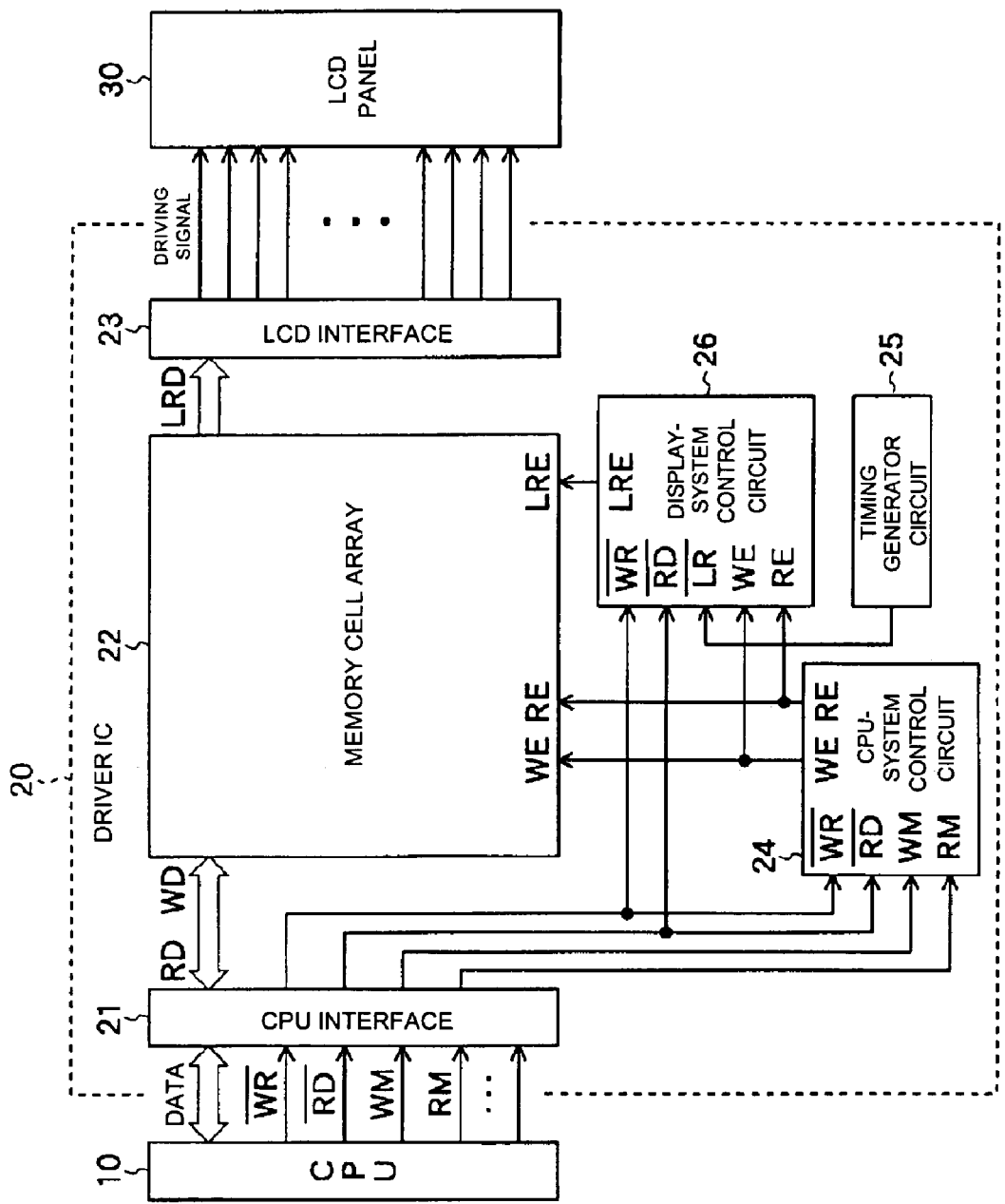
FIG. 1 is a block diagram showing the structure of a semiconductor integrated circuit according to a first embodiment of the present invention.

Embodiments of the present invention are described in detail hereinbelow with reference to the drawings. The same elements are given the same reference numerals, and a description thereof is omitted.

FIG. 1 is a block diagram showing the structure of a semiconductor integrated circuit according to a first embodiment of the present invention. In this embodiment, the present invention is applied to an LCD driver IC.

As shown in FIG. 1, an LCD driver IC 20 is connected to a CPU 10 and an LCD panel 30 for use.

The LCD driver IC 20 includes a CPU interface 21 used to connect to the CPU 10, an SRAM memory cell array 22 that stores data input from the CPU 10, an LCD interface 23 used to connect to the LCD panel 30, a CPU-system control circuit 24 that controls the memory cell array 22 based on a write request signal or read request signal from the CPU 10, a timing generator circuit 25 that generates a read request signal of the data to be supplied to the LCD panel 30 at the rate of 60 frames per seconds based on an oscillation signal output from an internal oscillation circuit of the LCD driver IC 20, and a display-system control circuit 26 that controls the memory cell array 22 based on the read request signal from the timing generator circuit 25.

In addition to data, various signals, such as a write request signal WR-bar, a read request signal RD-bar, a write-mode signal WM, and a read-mode signal RM, are input to the LCD driver IC 20 from the CPU 10. The CPU-system control circuit 24 generates a write control signal WE based on the write request signal WR-bar and the write-mode signal WM, and also generates a read control signal RE based on the read request signal RD-bar and the read-mode signal RM. The CPU-system control circuit 24 supplies the generated control signals to the memory cell array 22.

Based on these control signals, write-data WD sequentially input from the CPU 10 is written to the memory cell array 22, or data is also read from the memory cell array 22. The read data RD is sequentially output to the CPU 10.

A display-data read request signal LR-bar is input to the display-system control circuit 26 from the timing generator circuit 25. The write control signal WE and the read control signal RE are also input to the display-system control circuit 26 from the CPU-system control circuit 24. The display-system control circuit 26 generates a display-data read control signal LRE based on these signals, and supplies the generated signal LRE to the memory cell array 22.

Based on the display-data read control signal LRE, display-data is read from the memory cell array 22, and the read display-data LRD is output to the LCD interface 23. The LCD interface 23 generates a plurality of driving signals based on the display-data LRD, and outputs the generated signals to a plurality of segments of the LCD panel 30.

Figure 2:
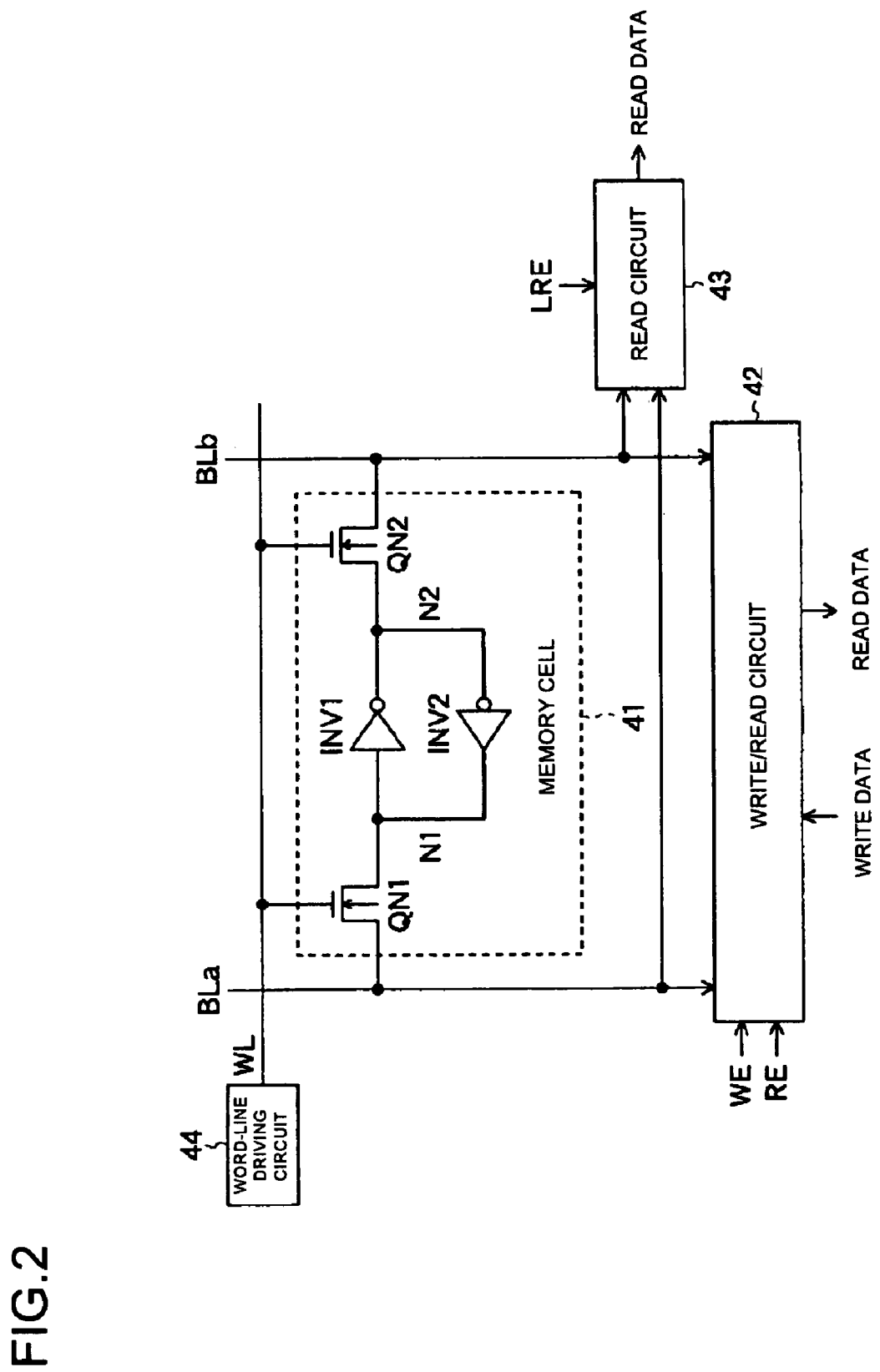
FIG. 2 is a diagram showing a memory cell array employed in the first embodiment of the present invention.

FIG. 2 is a diagram showing the structure of a memory cell array employed in this embodiment. The memory cell array shown in FIG. 2 includes an SRAM memory cell 41 having two storage nodes N1 and N2, a write/read circuit 42 that writes data to the memory cell 41 and reads data from the memory cell 41, a read circuit 43 that reads data from the memory cell 41 by a different system, and a word-line driving circuit 44 that drives a word line for data writing or reading.

The memory cell 41 includes inverter circuits INV1 and INV2, and n-channel MOS transistors QN1 and QN2 which form one port.

The input of the inverter circuit INV1 is connected with a first storage node N1, and the output thereof is connected with a second storage node N2. The input of the inverter circuit INV2 is connected with the second storage node N2, and the output thereof is connected with the first storage node N1.

The source-drain path of the transistor QN1 is connected between the first storage node N1 and a bit line BLa. The source-drain path of the transistor QN2 is connected between the second storage node N2 and a bit line BLb. Gates of the transistors QN1 and QN2 are connected with a word line WL.

Although only one memory cell 41 is shown in FIG. 2 for simple explanation, actually, a plurality of memory cells are formed into an array to form a memory cell array. One writing/reading word line WL is connected with the memory cells forming one row of the memory cell array. The set of bit lines BLa and BLb is connected with the memory cells forming one column of the memory cell array.

When the write control signal WE becomes high, data is written by the write/read circuit 42. For data writing, a high-level signal is supplied onto the word line WL from the word-line driving circuit 44, while, for example, a low-level signal is supplied onto the bit line BLa and a high-level signal is supplied onto the bit line BLb. The high-level signal is supplied onto the word line WL, thus causing the transistor QN1 to be turned on.

Thus, the storage node N1 becomes low as is the same as the bit line BLa, and the storage node N2 becomes high as is the same as the bit line BLb. The inverter circuits INV1 and INV2 maintain this state, thus allowing one-bit data to be stored in the memory cell 41.

When the read control signal RE becomes high, data is read by the write/read circuit 42. When the display-data read control signal LRE becomes high, data is read by the read circuit 43. For data reading, the bit lines BLa and BLb are pre-charged or pulled up. Then, a high-level signal is supplied onto the word line WL from the word-line driving circuit 44, and the transistor QN1 is turned on.

Thus, the bit line BLa becomes low as is the same as the storage node N1, and the bit line BLb is maintained high as is the same as the storage node N2. The write/read circuit 42 or the read circuit 43 uses a sense amp to detect the level of the bit lines BLa and BLb, so that one-bit data stored in the memory cell 41 is read.

Figure 3:
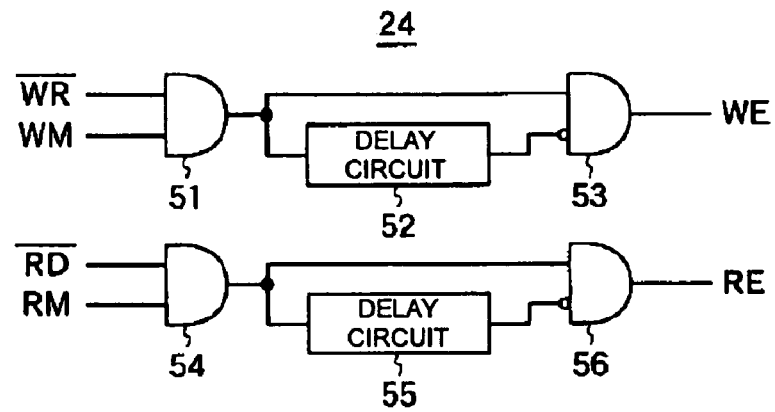
FIG. 3 is a diagram showing the structure of a CPU-system control circuit employed in the first embodiment of the present invention.

FIG. 3 is a diagram showing the structure of a CPU-system control circuit employed in this embodiment. A CPU-system control circuit 24 includes an AND circuit 51 to which a write request signal WR-bar and a write-mode signal WM are input, a delay circuit 52 that delays the output signal of the AND circuit 51 by a predetermined delay time D1, and an AND circuit 53, with one inverting input, to which the output signal of the AND circuit 51 and the output signal of the delay circuit 52 are input. These circuits generate a write control signal WE based on the write request signal WR-bar and the write-mode signal WM.

The CPU-system control circuit 24 further includes an AND circuit 54 to which a read request signal RD-bar and a read-mode signal RM are input, and a delay circuit 55 that delays the output signal of the AND circuit 54 by a predetermined delay time D2, and an AND circuit 56, with one inverting input, to which the output signal of the AND circuit 54 and the output signal of the delay circuit 55 are input.

These circuits generate a read control signal RE based on the read request signal RD-bar and the read-mode signal RM.

Figure 4:
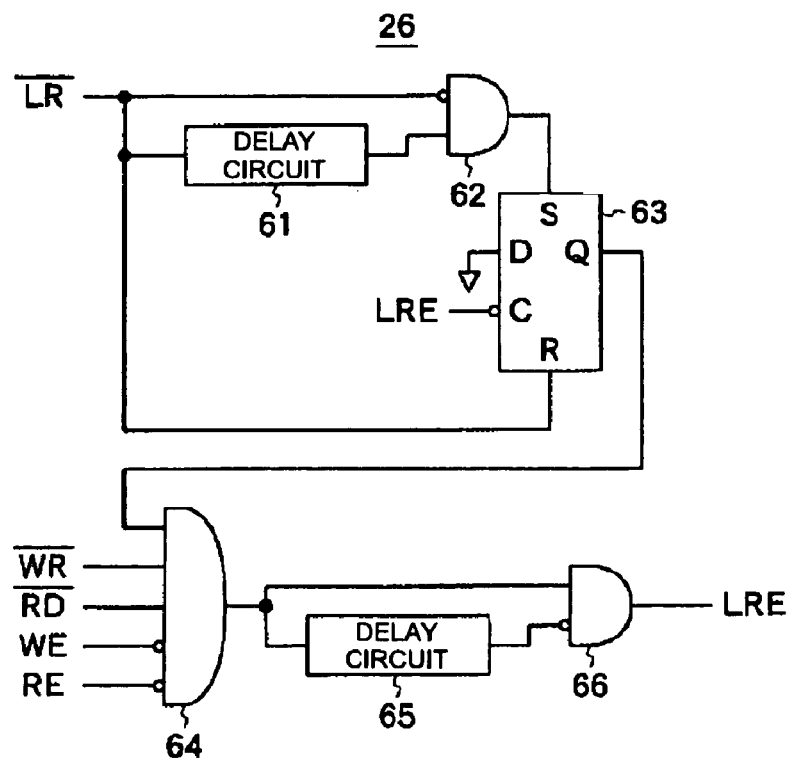
FIG. 4 is a diagram showing the structure of a display-system control circuit employed in the first embodiment of the present invention.

FIG. 4 is a diagram showing the structure of a display-system control circuit employed in this embodiment. A display-system control circuit 26 includes a delay circuit 61 that delays a display-data read request signal LR-bar by a predetermined delay time D3, an AND circuit 62, with one inverting input, to which the display-data read request signal LR-bar and the output signal of the delay circuit 61 are input, a flip-flop 63 which is reset by the display-data read request signal LR-bar and which is set by the output signal of the AND circuit 62, and a five-input AND circuit 64.

When the display-data read request signal LR-bar goes low, the flip-flop 63 cancels the reset so that an output signal Q of the flip-flop 63 is set to high.

The output signal Q of the flip-flop 63 returns to low in synchronization with the falling edge of a display-data read control signal LRE. The output signal Q of the flip-flop 63, a write request signal WR-bar, and a read request signal RD-bar are input to three input terminals of the AND circuit 64, and a write control signal WE and a read control signal RE are input to two inverting input terminals of the AND circuit 64.

The display-system control circuit 26 further includes a delay circuit 65 that delays the output signal of the AND circuit 64 by a predetermined delay time D4, and an AND circuit 66, with one inverting input, to which the output signal of the AND circuit 64 and the output signal of the delay circuit 65 are input and from which the display-data read control signal LRE is output.

The write control operation and read control operation of the semiconductor integrated circuit according to the first embodiment of the present invention are described hereinbelow.

Figure 5:
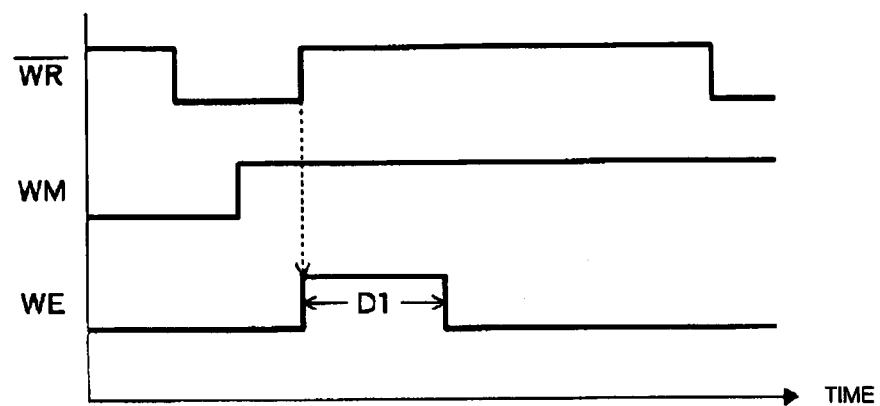
FIG. 5 is a timing diagram for describing the operation of the CPU-system control circuit shown in FIG. 3.

FIG. 5 is a timing chart for describing the write control operation of the CPU-system control circuit shown in FIG. 3. As shown in FIG. 5, the write-mode signal WM rises while the write request signal WR-bar is low, and the output signal of the AND circuit 51 becomes high when the write request signal WR-bar returns to high. The output signal of the AND circuit 51 is supplied to the first input terminal of the AND circuit 53, and is also supplied to the second input terminal (inverting input) of the AND circuit 53 via the delay circuit 52 having the delay time D1.

The write control signal WE output from the AND circuit 53 is high for a period equal to the delay time D1 of the delay circuit 52. In a period during which the write control signal WE is high, the data input from the CPU 10 shown in FIG. 1 via the CPU interface 21 is written to the memory cell array 22.

Figure 6:
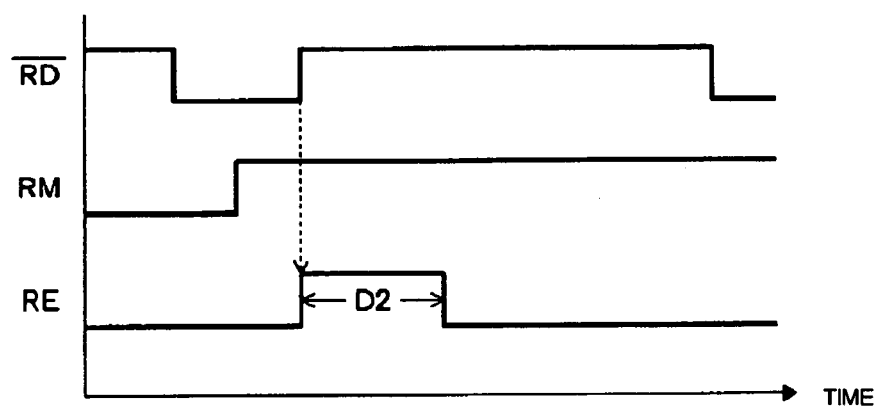
FIG. 6 is a timing diagram for describing the operation of the CPU-system control circuit shown in FIG. 3.

FIG. 6 is a timing chart for describing the read control operation of the CPU-system control circuit shown in FIG. 3. As shown in FIG. 6, the read-mode signal RM rises while the read request signal RD-bar is low, and the output signal of the AND circuit 54 becomes high when the read request signal RD-bar returns to high. The output signal of the AND circuit 54 is supplied to the first input terminal of the AND circuit 56, and is also supplied to the second input terminal (inverting input) of the AND circuit 56 via the delay circuit 55 having the delay time D2.

The read control signal RE output from the AND circuit 56 is high for a period equal to the delay time D2 of the delay circuit 55. In a period during which the read control signal RE is high, data is read from the memory cell array 22 shown in FIG. 1, and the read data is output to the CPU 10 via the CPU interface 21.

Figure 7:
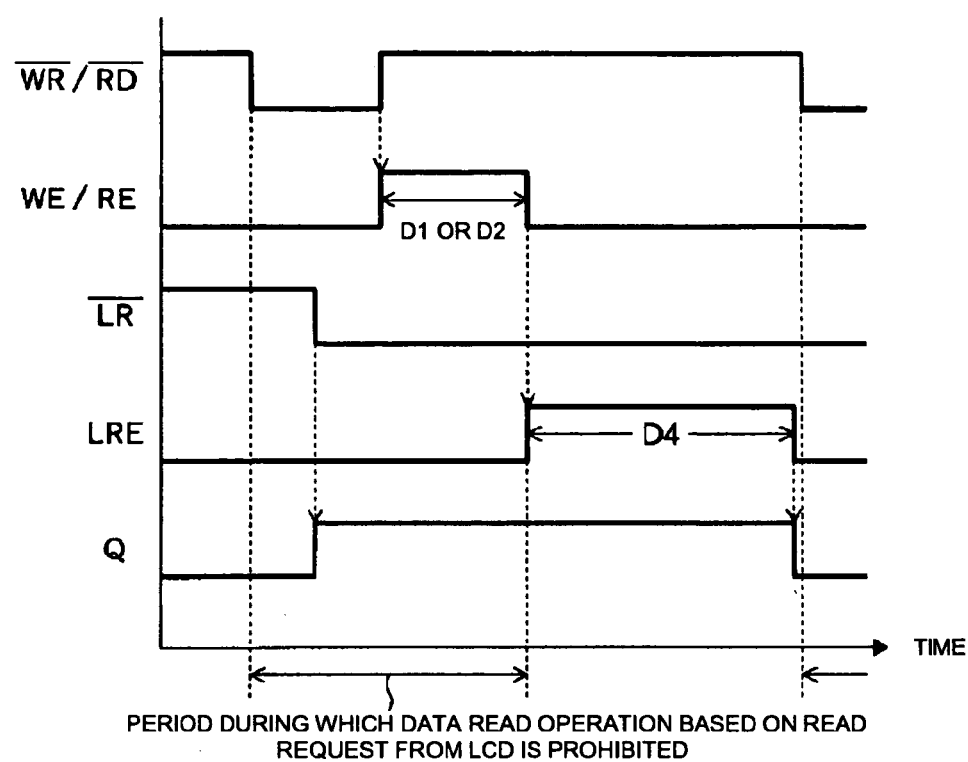
FIG. 7 is a timing diagram for describing the operation of the display-system control circuit shown in FIG. 4.

FIG. 7 is a timing chart for describing the read control operation of the display-system control circuit shown in FIG. 4. As shown in FIG. 4, the flip-flop 63 is reset for a period during which the display-data read request signal LR-bar is high. When the display-data read request signal LR-bar falls, the output signal of the AND circuit 62 becomes high for a period equal to the delay time D3 of the delay circuit 61. Thus, the output signal Q of the flip-flop 63 is set to high.

When the write request signal WR-bar or the read request signal RD-bar goes high, the write control signal WE or the read control signal RE becomes high for a predetermined period. When the write control signal WE or the read control signal RE returns to low, the output signal of the five-input AND circuit 64 becomes high. The output signal of the AND circuit 64 is supplied to the first input terminal of the AND circuit 66, and is also supplied to the second input terminal (inverting input) of the AND circuit 66 via the delay circuit 65 having the delay time D4.

As a result, the display-data read control signal LRE output from the AND circuit 66 is high for a period equal to the delay time D4 of the delay circuit 65. In a period during which the display-data read control signal LRE is high, data is read from the memory cell array 22 shown in FIG. 1, and the read data is output to the LCD interface 23 so as to generate a driving signal for driving the LCD panel 30.

According to this embodiment, when the write request signal WR-bar and read request signal RD-bar sent from the CPU 10 are inactive, and the write control signal WE and read control signal RE generated by the CPU-system control circuit 24 are inactive, the display-system control circuit 26 activates the display-data read control signal LRE based on the display-data read request signal LR-bar sent from the timing generator circuit 25.

In other words, in a period during which any one of the write request signal WR-bar, the read request signal RD-bar, the write control signal WE, and the read control signal RE is active, activation of the display-data read control signal LRE is prohibited. In this manner, the data read operation to display an image on the LCD panel 30 can be performed smoothly, while giving priority to the data write/read operation of the CPU 10.

A semiconductor integrated circuit according to a second embodiment of the present invention is described hereinbelow. The second embodiment relates to a modification of the display-system control circuit in the first embodiment, and other portions are similar to those of the first embodiment.

Figure 8:
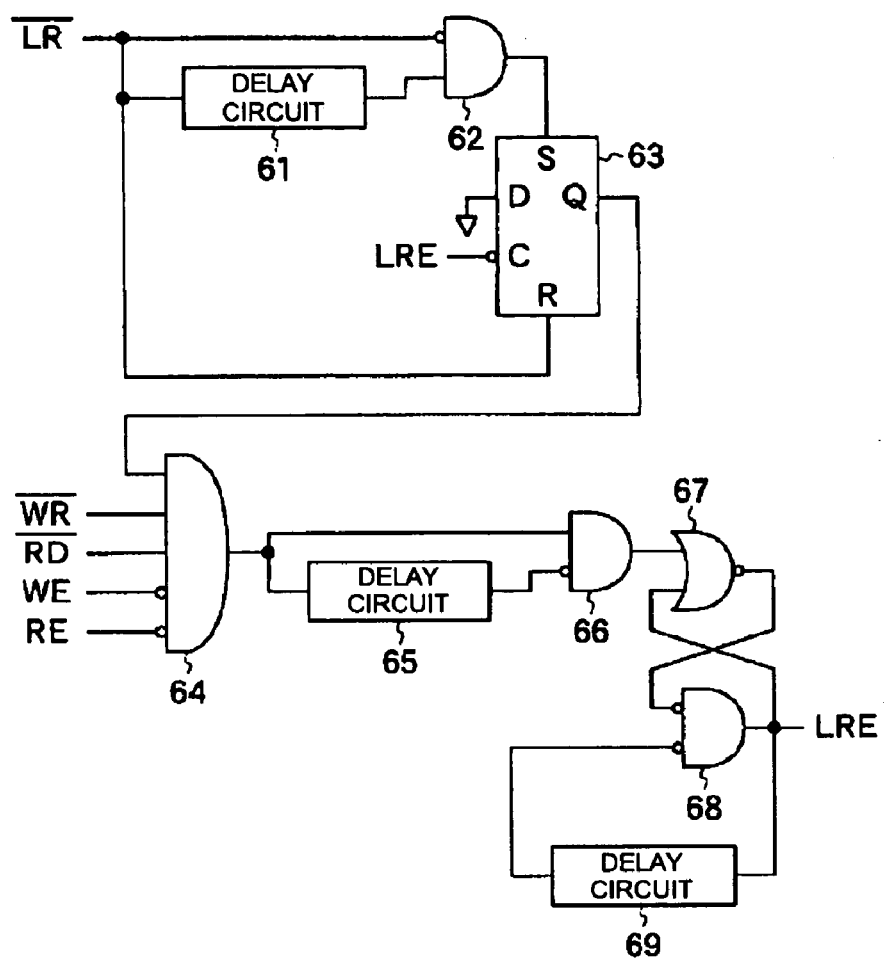
FIG. 8 is a diagram showing the structure of a display-system control circuit employed in a second embodiment of the present invention.

FIG. 8 is a diagram showing the structure of a display-system control circuit employed in the second embodiment of the present invention. This display-system control circuit includes a delay circuit 61 that delays a display-data read request signal LR-bar by a predetermined delay time D3, an AND circuit 62, with one inverting input, to which the display-data read request signal LR-bar and the output signal of the delay circuit 61 are input, a flip-flop 63 which is reset by the display-data read request signal LR-bar and which is set by the output signal of the AND circuit 62, and a five-input AND circuit 64.

When the display-data read request signal LR-bar goes low, the flip-flop 63 cancels the reset so that an output signal Q of the flip-flop 63 is set to high.

The output signal Q of the flip-flop 63 returns to low in synchronization with the falling edge of a display-data read control signal LRE. The output signal Q of the flip-flop 63, a write request signal WR-bar, and a read request signal RD-bar are input to three input terminals of the AND circuit 64, and a write control signal WE and a read control signal RE are input to two inverting input terminals of the AND circuit 64.

The display-system control circuit further includes a delay circuit 65 that delays the output signal of the AND circuit 64 by a predetermined delay time D4, an AND circuit 66, with one inverting input, to which the output signal of the AND circuit 64 and the output signal of the delay circuit 65 are input, an NOR circuit 67, an AND circuit 68 with inverting inputs, and a delay circuit 69 that delays the output signal of the AND circuit 68 by a predetermined delay time D5. When the output signal of the AND circuit 66 becomes high, the AND circuit 68 outputs the display-data read control signal LRE which is high for a period equal to the delay time D5.

The read control operation of the semiconductor integrated circuit according to the second embodiment of the present invention is described hereinbelow.

Figure 9:
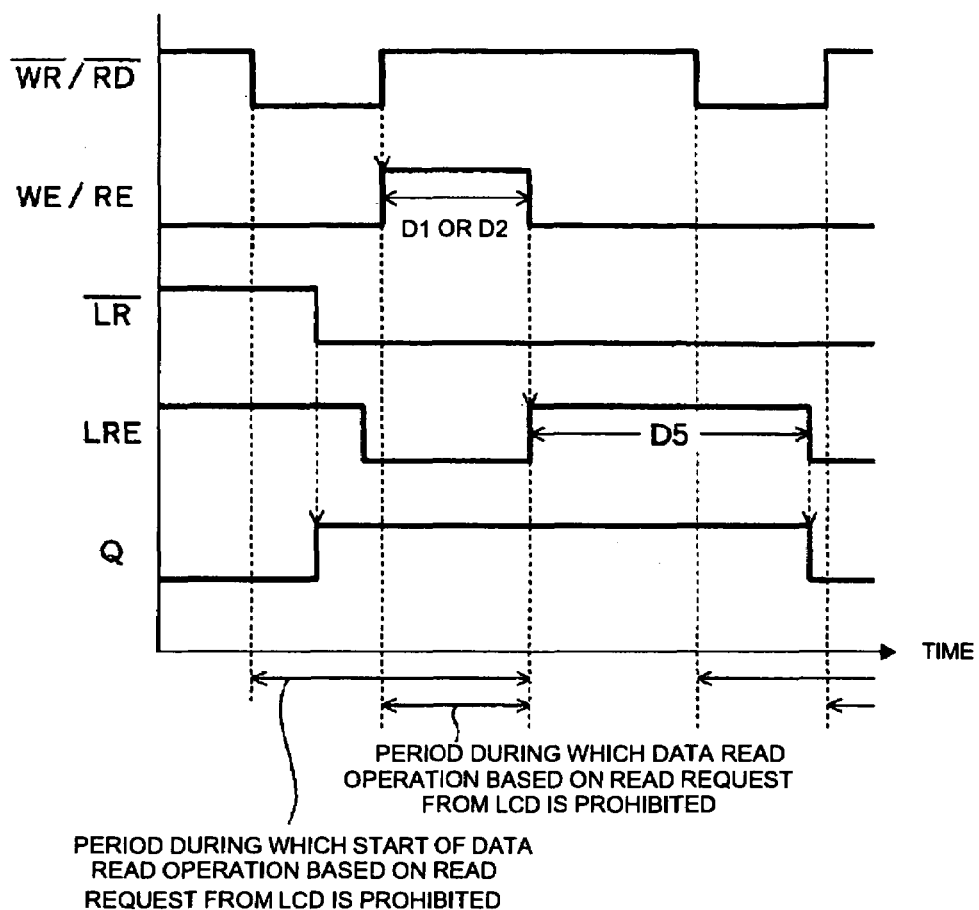
FIG. 9 is a timing diagram for describing the operation of the display-system control circuit shown in FIG. 8.

FIG. 9 is a timing chart for describing the read control operation of the display-system control circuit shown in FIG. 8.

The flip-flop 63 is reset for a period during which the display-data read request signal LR-bar is high. When the display-data read request signal LR-bar falls, the output signal of the AND circuit 62 becomes high for a period equal to the delay time D3 of the delay circuit 61. Thus, the output signal Q of the flip-flop 63 is set to high.

When the write request signal WR-bar or the read request signal RD-bar goes high, the write control signal WE or the read control signal RE becomes high for a predetermined period. When the write control signal WE or the read control signal RE returns to low, the output signal of the five-input AND circuit 64 becomes high. The output signal of the AND circuit 64 is supplied to the first input terminal of the AND circuit 66, and is also supplied to the second input terminal (inverting input) of the AND circuit 66 via the delay circuit 65 having the delay time D4.

The output signal of the AND circuit 66 is supplied to a first input terminal of the NOR circuit 67, and the output signal of the NOR circuit 67 is supplied to a first input terminal of the AND circuit 68.

The display-data read control signal LRE output from the AND circuit 68 is supplied to second input terminal of the NOR circuit 67, and is also supplied to a second input terminal of the AND circuit 68 via the delay circuit 69 having the delay time D5.

As a result, the display-data read control signal LRE is high for a period equal to the delay time D5 of the delay circuit 69. The delay time D5 of the delay circuit 69 is defined so that the display-data read control signal LRE returns to low before the next time the write request signal WR-bar or the read request signal RD-bar rises.

According to this embodiment, therefore, when the write control signal WE and read control signal RE generated by the CPU-system control circuit are inactive, the display-system control circuit activates the display-data read control signal LRE. In other words, in a period during which the write control signal WE or the read control signal RE is active, activation of the display-data read control signal LRE is prohibited.

When the write request signal WR-bar and read request signal RD-bar sent from the CPU 10 are inactive, and the write control signal WE and read control signal RE generated by the CPU-system control circuit are inactive, the display-system control circuit starts activation of the display-data read control signal LRE based on the display-data read request signal LR-bar sent from the timing generator circuit 25.

In other words, in a period during which any one of the write request signal WR-bar, the read request signal RD-bar, the write control signal WE, and the read control signal RE is active, the start of activation of the display-data read control signal LRE is prohibited. However, when the write control signal WE and the read control signal RE are inactive even if either the write request signal WR-bar or the read request signal RD-bar is active, the data read operation to display an image on the LCD panel 30 can be continuously performed.

According to this embodiment, therefore, the data write or read cycle time can be reduced compared to the first embodiment.

A semiconductor integrated circuit according to a third embodiment of the present invention is described hereinbelow. The third embodiment relates to a modification of the CPU-system control circuit and display-system control circuit in the first embodiment, and other portions are similar to those of the first embodiment.

Figure 10:
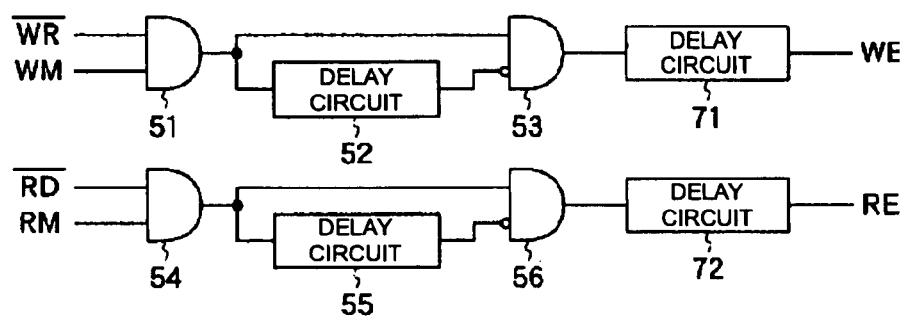
FIG. 10 is a diagram showing the structure of a CPU-system control circuit employed in a third embodiment of the present invention.

FIG. 10 is a diagram showing the structure of a CPU-system control circuit employed in this embodiment. This CPU-system control circuit includes an AND circuit 51 to which a write request signal WR-bar and a write-mode signal WM are input, a delay circuit 52 that delays the output signal of the AND circuit 51 by a predetermined delay time D1, an AND circuit 53, with one inverting input, to which the output signal of the AND circuit 51 and the output signal of the delay circuit 52 are input, and a delay circuit 71 that delays the output signal of the AND circuit 53 by a predetermined delay time D6.

It is assumed herein that $D6 \geq D5$. These circuits generate a write control signal WE based on the write request signal WR-bar and the write-mode signal WM. The delay circuit 71 may be placed close to an input terminal of the AND circuit 51, or may be placed between the AND circuits 51 and 53.

The CPU-system control circuit further includes an AND circuit 54 to which a read request signal RD-bar and a read-mode signal RM are input, a delay circuit 55 that delays the output signal of the AND circuit 54 by a predetermined delay time D2, an AND circuit 56, with one inverting input, to which the output signal of the AND circuit 54 and the output signal of the delay circuit 55 are input, and a delay circuit 72 that delays the output signal of the AND circuit 56 by a predetermined delay time D7. It is assumed herein that $D7 \geq D5$. These circuits generate a read control signal RE based on the read request signal RD-bar and the read-mode signal RM. The delay circuit 72 may be placed close to an input terminal of the AND circuit 54, or may be placed between the AND circuits 54 and 56.

Figure 11:
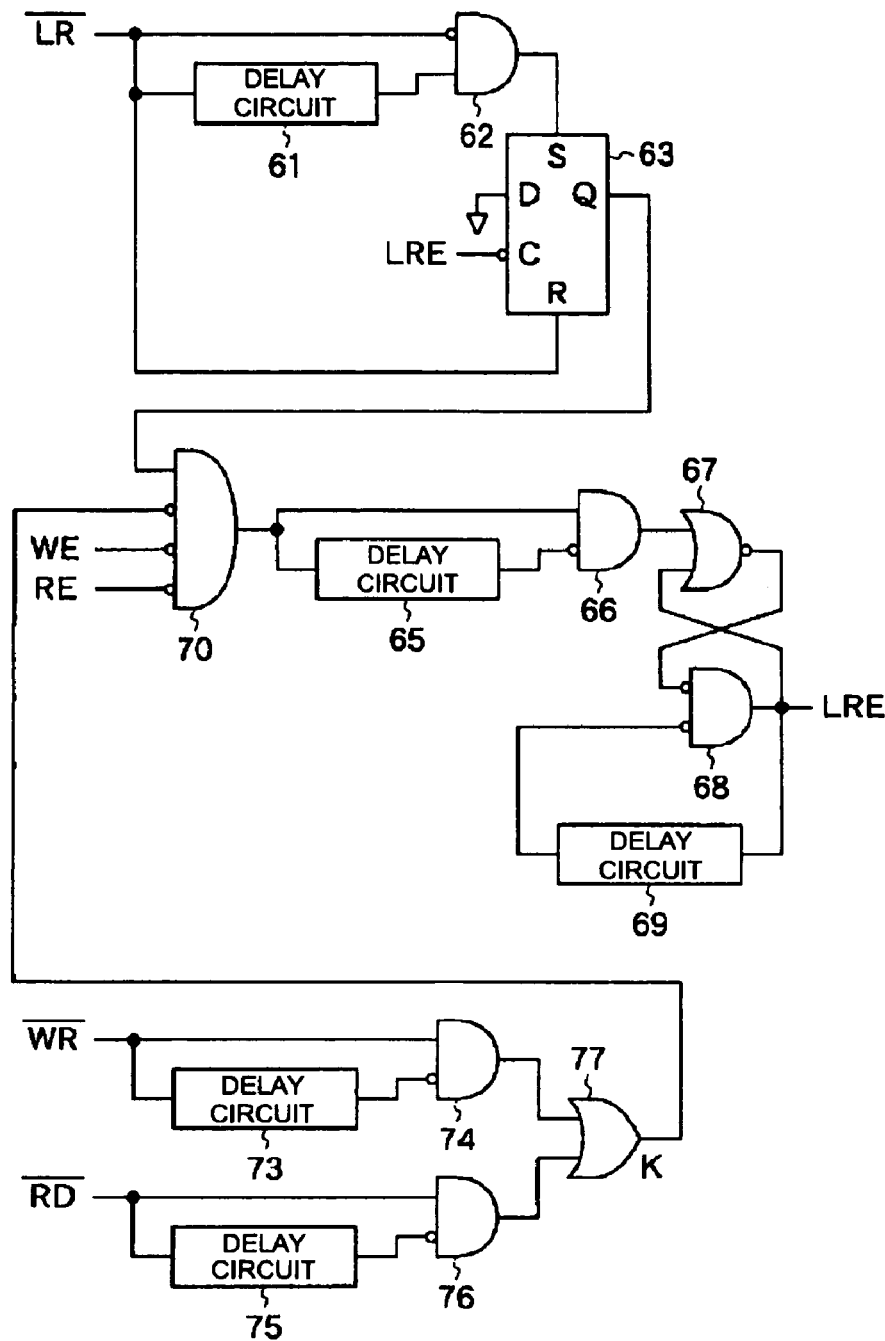
FIG. 11 is a diagram showing the structure of a display-system control circuit employed in the third embodiment of the present invention.

FIG. 11 is a diagram showing the structure of a display-system control circuit employed in the third embodiment of the present invention. This display-system control circuit includes a delay circuit 61 that delays a display-data read request signal LR-bar by a predetermined delay time D3, an AND circuit 62, with one inverting input, to which the display-data read request signal LR-bar and the output signal of the delay circuit 61 are input, a flip-flop 63 which is reset by the display-data read request signal LR-bar and which is set by the output signal of the AND circuit 62, and a four-input AND circuit 70.

When the display-data read request signal LR-bar goes low, the flip-flop 63 cancels the reset so that an output signal Q of the flip-flop 63 is set to high.

The output signal Q of the flip-flop 63 returns to low in synchronization with the falling edge of a display-data read control signal LRE. The output signal Q of the flip-flop 63 is input to an input terminal of the AND circuit 70, and a signal K indicating the state where no write or read request is made from the CPU 10, a write control signal WE, and a read control signal RE are input to three inverting input terminals of the AND circuit 70.

The display-system control circuit further includes a delay circuit 73 that delays a write request signal WR-bar by a predetermined delay time D8, an AND circuit 74, with one inverting input, to which the write request signal WR-bar and the output signal of the delay circuit 73 are input, a delay circuit 75 that delays a read request signal RD-bar by a predetermined delay time D9, an AND circuit 76, with one inverting input, to which the read request signal RD-bar and the output signal of the delay circuit 75 are input, and an OR circuit 77 which outputs the signal K based on the output signals of the AND circuits 74 and 76, where $D8 \geq D1+D6$ and $D9 \geq D2+D7$.

The display-system control circuit further includes a delay circuit 65 that delays the output signal of the AND circuit 70 by a predetermined delay time D4, an AND circuit 66, with one inverting input, to which the output signal of the AND circuit 70 and the output signal of the delay circuit 65 are input, an NOR circuit 67, an AND circuit 68 with inverting inputs, and a delay circuit 69 that delays the output signal of the AND circuit 68 by a predetermined delay time D5. When the output signal of the AND circuit 66 becomes high, the AND circuit 68 outputs the display-data read control signal LRE which is high for a period equal to the delay time D5.

The read control operation of the semiconductor integrated circuit according to the third embodiment of the present invention is described hereinbelow. The write control operation and the read control operation of the CPU-system control circuit are similar to those described with reference to FIGS. 5 and 6, except that the write control signal WE, which is delayed by the delay circuit 71 by the delay time D6, is generated and the read control signal RE, which is delayed by the delay circuit 72 by the delay time D7, is generated.

Figure 12:
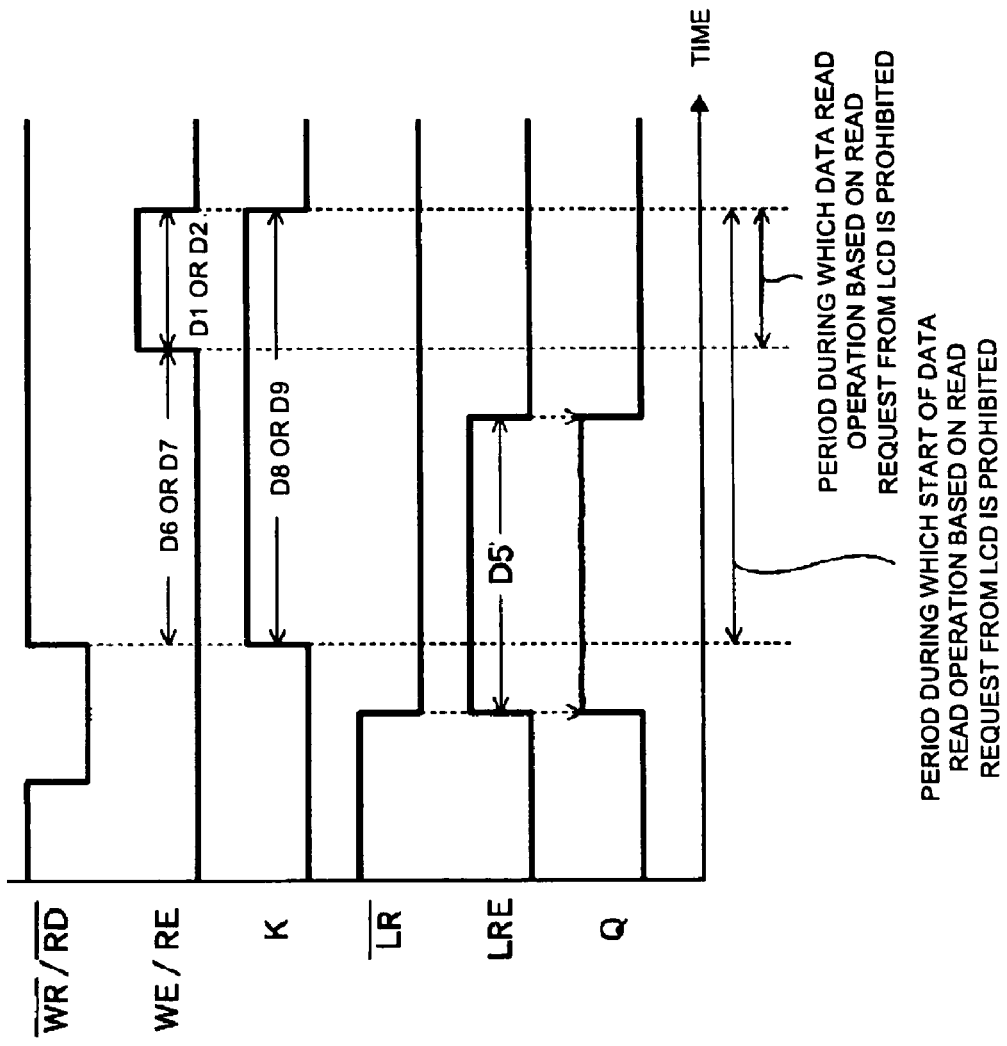
FIG. 12 is a timing diagram for describing the operation of the display-system control circuit shown in FIG. 11.
Figure 13:
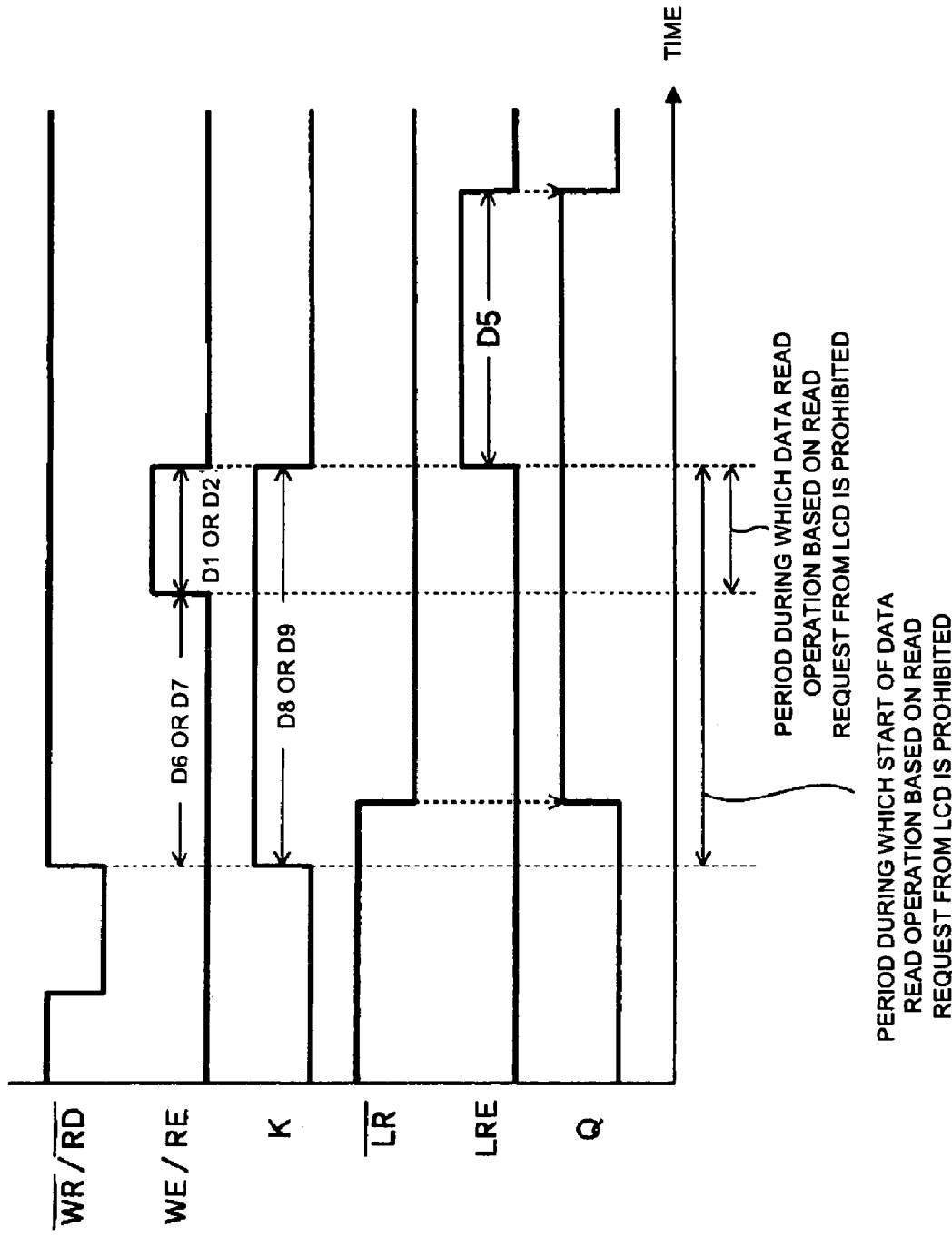
FIG. 13 is a timing diagram for describing the operation of the display-system control circuit shown in FIG. 11.

FIGS. 12 and 13 are timing charts for describing the read control operation of the display-system control circuit shown in FIG. 11. FIG. 12 is a chart for describing the read control operation in a case where the display-data read request signal LR-bar has been received before the write request signal WR-bar or the read request signal RD-bar is completely received. FIG. 13 is a chart for describing the read control operation in a case where the display-data read request signal LR-bar is received within a predetermined period after the write request signal WR-bar or the read request signal RD-bar is completely received.

As shown in FIG. 12, when the display-data read request signal LR-bar falls, the output signal of the AND circuit 62 becomes high for a period equal to the delay time D3 of the delay circuit 61, and the output signal Q of the flip-flop 63 is set to high. The write request signal WR-bar and the read request signal RD-bar are low, and the signal K, the write control signal WE; whereas, the read control signal RE become low, and the display-data read control signal LRE becomes high for a period equal to the delay time D5.

When the write request signal WR-bar goes high, the write control signal WE becomes high for a predetermined period after the time equal to the delay time D6 elapses. In other words, the write control signal WE is maintained low for a period equal to the delay time D6. Since D6≧D5, no contention occurs between the data read control for display and the data write control from the CPU.

When the read request signal RD-bar goes high, the read control signal RE becomes high for a predetermined period after the time equal to the delay time D7 elapses. In other words, the read control signal RE is maintained low for a period equal to the delay time D7. Since D7≧D5, no contention occurs between the data read control for display and the data read control from the CPU.

Therefore, even in a period during which the write request signal WR-bar or the read request signal RD-bar is active, activation of the display-data read control signal LRE is not prohibited, thus allowing data to be immediately read for display.

As shown in FIG. 13, in the case where the display-data read request signal LR-bar is received within a predetermined period after the write request signal WR-bar or the read request signal RD-bar is completely received, the signal K becomes high, and the display-data read control signal LRE is maintained low. When the signal K becomes low, the display-data read control signal LRE goes high.

When the write request signal WR-bar goes high, the write control signal WE becomes high for a period equal to the delay time D1 after the time equal to the delay time D6 elapses. In other words, the display-data read control signal LRE is maintained low for a period equal to the delay time D8. Since D8≧D1+D6, no contention occurs between the data write control from the CPU and the data read control for display.

When the read request signal RD-bar goes high, the read control signal RE becomes high for a period equal to the delay time D2 after the time equal to the delay time D7 elapses. In other words, the display-data read control signal LRE is maintained low for a period equal to the delay time D9. Since D9≧D2+D7, no contention occurs between the data read control from the CPU and the data read control for display.

Therefore, even in a period during which the display-data read request signal LR-bar is active, activation of the write control signal WE and the read control signal RE is not prohibited, thus allowing for immediate access from the CPU.

According to this embodiment, therefore, the display-system control circuit starts activation of the display-data read control signal LRE based on the display-data read request signal LR-bar sent from the timing generator circuit for the period except for a period after completion of activation of the write request signal WR-bar sent from the CPU until completion of activation of the write control signal WE generated by the CPU-system control circuit and a period after completion of activation of the read request signal RD-bar sent from the CPU until completion of activation of the read control signal RE generated by the CPU-system control circuit. Therefore, activation of the display-data read control signal LRE is prohibited for these periods.

When the write control signal WE and read control signal RE generated by the CPU-system control circuit are inactive, the display-system control circuit activates the display-data read control signal LRE. In other words, activation of the display-data read control signal LRE is prohibited for a period during which the write control signal WE or the read control signal RE is active.

However, if the write control signal WE and the read control signal RE are inactive even after completion of activation of the write request signal WR-bar or after completion of activation of the read request signal RD-bar, the data read operation to display an image on the LCD panel 30 can be continuously performed. According to this embodiment, therefore, the data write or read cycle time can be reduced compared to the first and second embodiments.

A semiconductor integrated circuit according to a fourth embodiment of the present invention is described hereinbelow. The fourth embodiment relates to a modification of the display-system control circuit in the third embodiment, and other portions are similar to those of the third embodiment.

Figure 14:
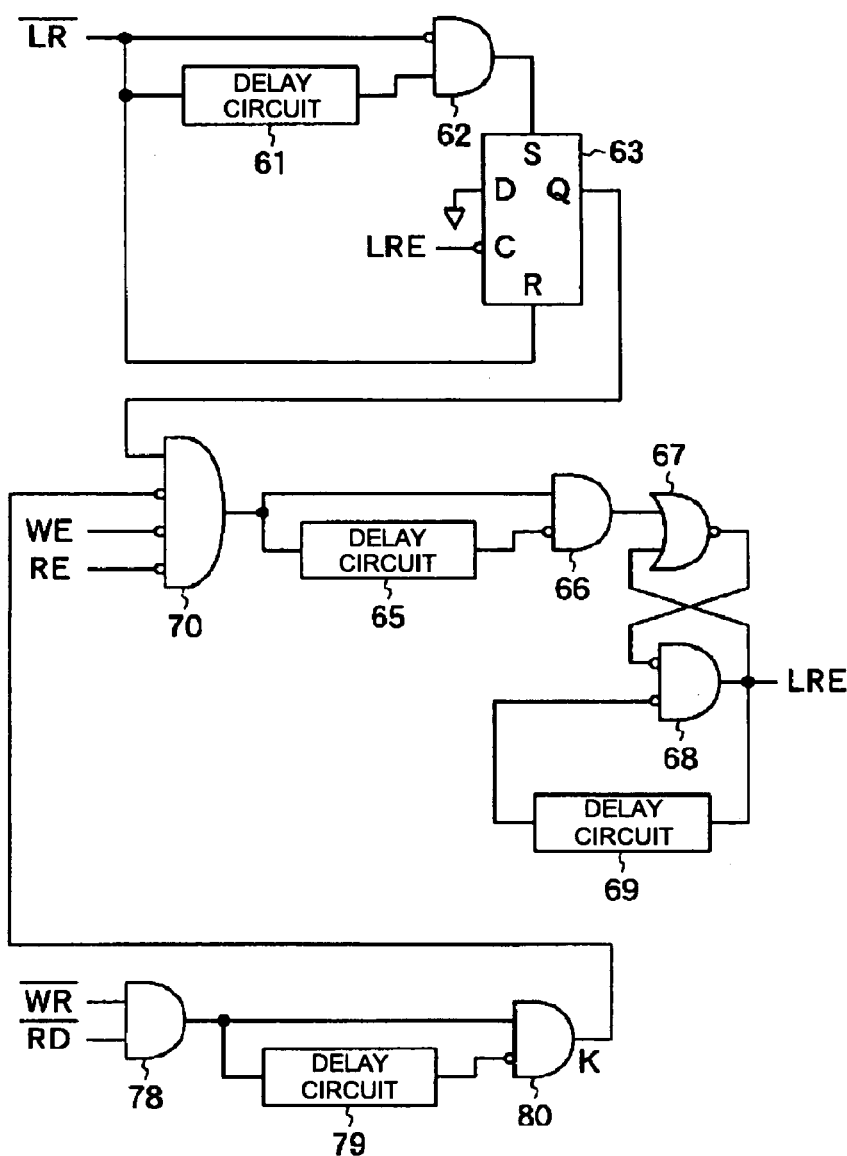
FIG. 14 is a diagram showing the structure of a display-system control circuit employed in a fourth embodiment of the present invention.

FIG. 14 is a diagram showing the structure of a display-system control circuit employed in the fourth embodiment of the present invention. This display-system control circuit includes, in place of the circuits 73 through 77 shown in FIG. 11 for generating the signal K, an AND circuit 78 to which a write request signal WR-bar and a read request signal RD-bar are input, a delay circuit 79 that delays the output signal of the AND circuit 78 by a predetermined delay time D10, and an AND circuit 80, with one inverting input, to which the output signals of the AND circuit 78 and the delay circuit 79 are input. It is assumed herein that D10≧D1+D6 and D10≧D2+D7. The read control operation of the semiconductor integrated circuit according to this embodiment is similar to that described with reference to FIGS. 12 and 13.

A semiconductor integrated circuit according to a fifth embodiment of the present invention is described hereinbelow. In the fifth embodiment, a memory cell array including multiple memory cells is divided into a plurality of blocks (also referred to as "banks") for control.

Figure 15:
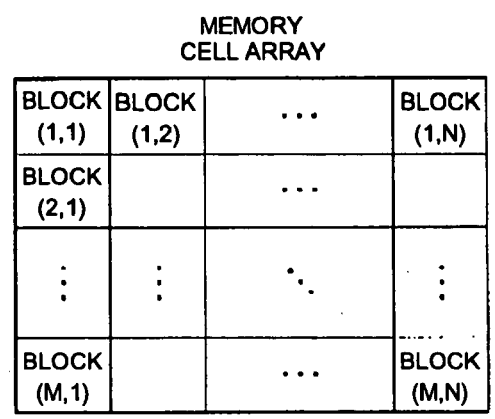
FIG. 15 is a view showing a memory cell array employed in a fifth embodiment of the present invention.

FIG. 15 is a view showing the structure of a memory cell array employed in the fifth embodiment of the present invention. As shown in FIG. 15, the memory cell array is divided into M by N blocks, and a given block is represented by (m, n). A block selecting signal BS(m, n) is used to select this block.

Figure 16:
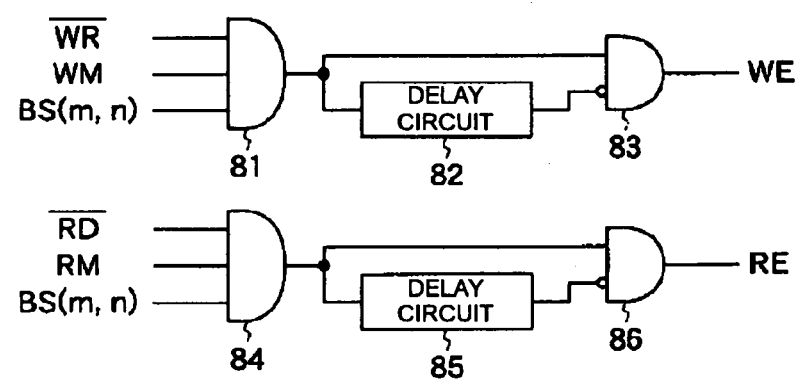
FIG. 16 is a diagram showing the structure of a CPU-system control circuit employed in the fifth embodiment of the present invention.

FIG. 16 is a diagram showing the structure of a CPU-system control circuit employed in this embodiment. The CPU-system control circuit divides the memory cell array into the plurality of blocks for control so that data is written or read based on a write request or read request from the CPU 10.

The CPU-system control circuit includes AND circuits 81 to which a write request signal WR-bar, a write-mode signal WM, and a block selecting signal BS(m, n) are input, delay circuits 82 that delay the output signal of the AND circuit 81 by a predetermined delay time, and AND circuits 83, each with one inverting input, to which the output signal of the AND circuit 81 and the output signal of the delay circuit 82 are input. The number of AND circuits 81, delay circuits 82, and AND circuits 83 corresponds to the number of blocks. When a block (m, n) is selected, these circuits generate a write control signal WE for this block (m, n) based on the write request signal WR-bar and the write-mode signal WM.

The CPU-system control circuit further includes AND circuits 84 to which a write request signal RD-bar, a read-mode signal RM, and a block selecting signal BS (m,n) are input, delay circuits 85 that delay the output signal of the AND circuit 84 by a predetermined delay time, and AND circuits 86, each with one inverting input to which the output signal of the AND circuit 84 and the output signal of the delay circuit 85 are input. The number of AND circuits 84, delay circuits 85, and AND circuits 86 corresponds to the number of blocks. When a block (m, n) is selected, these circuits generate a read control signal RE for the selected block (m, n) based on the read request signal RD-bar and the read-mode signal RM.

The display-system control circuit divides the memory cell array into a plurality of blocks for control so that data is not read based on a read request from the timing generator circuit 25 from the block where data is being written or read based on a request from the CPU 10, and also divides the memory cell array into a plurality of blocks for control so that the data to be supplied to the LCD panel 30 is read from the block where data is not being written or read based on a request from the CPU 10.

The read control operation of the semiconductor integrated circuit according to the fifth embodiment of the present invention is described hereinbelow.

Figure 17:
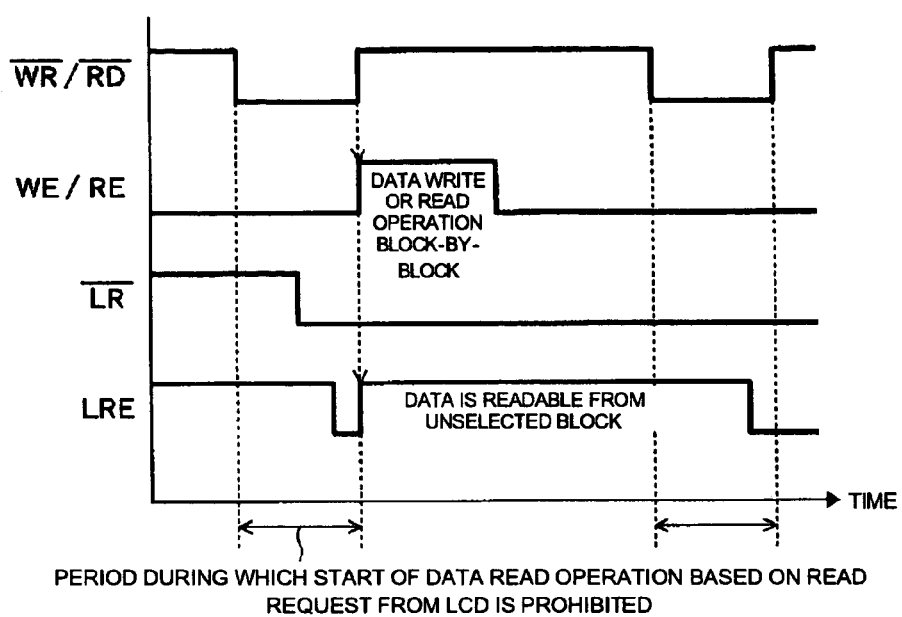
FIG. 17 is a timing diagram for describing the operation of a display-system control circuit employed in the fifth embodiment of the present invention.
Figure 18:
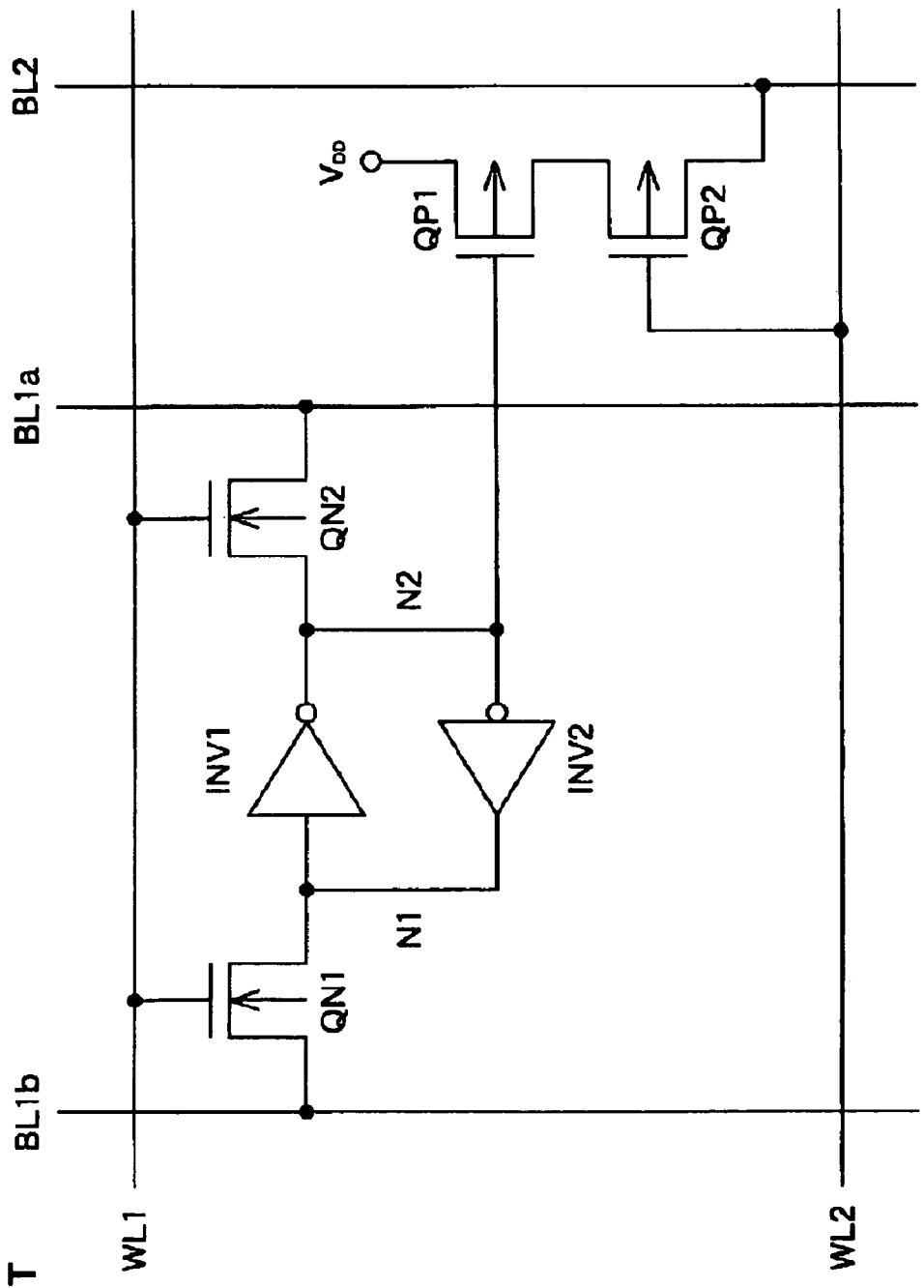
FIG. 18 is a diagram showing the structure of a dual-port memory cell of the related art.

FIG. 17 is a timing chart for describing the read control operation of the display-system control circuit employed in the fifth embodiment of the present invention.

When the write request signal WR-bar or the read request signal RD-bar goes high, the write control signal WE or read control signal RE for the selected block (m, n) in turn becomes high. Thus, data is written or read for each block (m, n) in turn based on a request from the CPU 10.

When a display-data read request signal LR-bar falls while the write request signal WR-bar or the read request signal RD-bar is low, a display-data read control signal LRE for each block (m, n) in turn becomes high after the write request signal WR-bar or the read request signal RD-bar becomes high. Thus, the data to be supplied to the LCD panel 30 is read for each block (m, n) in turn. However, with respect to the block selected based on a request from the CPU 10, the display-data read control signal LRE is low for a period during which the write control signal WE or the read control signal RE is high, and data is written to or read from this block based on a request from the CPU 10 by priority.

In this embodiment, the start of activation of the display-data read control signal LRE based on the display-data read request signal LR-bar sent from the timing generator circuit 25 is prohibited for a period during which the write request signal WR-bar or read request signal RD-bar sent from the CPU 10 is active. However, when the write control signal WE and the read control signal RE are inactive even if either the write request signal WR-bar or the read request signal RD-bar is active, the data read operation to display an image on the LCD panel 30 can be continuously performed.

According to this embodiment, while a one-port memory cell is used, the data write/read operation in accordance with an instruction from a CPU and the data read operation to display an image on a display panel can be concurrently performed on different blocks in a single memory cell array. Therefore, the data write or read cycle time can further be reduced.

What is claimed is:

1. A semiconductor integrated circuit comprising:
a memory cell having a port through which data is input to and output from a set of bit lines when a word line is driven;
a write/read circuit connected with the port via the set of bit lines for writing data to the memory cell and for reading data from the memory cell;
a read circuit connected with the port via the set of bit lines for reading data from the memory cell;
a CPU-system control circuit that controls the write/read circuit so that a data write or read operation based on at least one of a write request and a read request from a CPU is performed for a first period; and
a display-system control circuit that controls the read circuit so that data to be supplied to a display panel is read for a second period which does not overlap the first period,
wherein the CPU-system control circuit includes:
a first circuit that activates a write control signal based on a write request signal sent from the CPU; and
a second circuit that activates a read control signal based on a read request signal sent from the CPU, and
the display-system control circuit includes a third circuit that activates a display-data read control signal based on at least the write request signal and read request signal sent from the CPU and a display-data read request signal sent from a timing generator circuit.

2. A semiconductor integrated circuit according to claim 1, wherein the third circuit activates the display-data read control signal based on the display-data read request signal sent from the timing generator circuit when the write request signal and read request signal sent from the CPU are inactive and when the write control signal and read control signal generated by the CPU-system control circuit are inactive.

3. A semiconductor integrated circuit according to claim 1, wherein the third circuit starts activation of the display-data read control signal based on the display-data read request signal sent from the timing generator circuit when the write request signal and read request signal sent from the CPU are inactive and when the write control signal and read control signal generated by the CPU-system control circuit are inactive; and activates the display-data read control signal when the write control signal and read control signal generated by the CPU-system control circuit are inactive.

4. A semiconductor integrated circuit according to claim 1, wherein the third circuit starts activation of the display-data read control signal based on the display-data read request signal sent from the timing generator circuit for a period except for a period after completion of activation of the write request signal sent from the CPU until completion of activation of the write control signal generated by the CPU-system control circuit and a period after completion of activation of the read request signal sent from the CPU until completion of activation of the read control signal generated by the CPU-system control circuit; and activates the display-data read control signal for a first period when the write control signal and read control signal generated by the CPU-system control circuit are inactive,
the first circuit starts activation of the write control signal when a second period longer than the first period has elapsed after completion of activation of the write request signal sent from the CPU, and
the second circuit starts activation of the read control signal when a third period longer than the first period has elapsed after completion of activation of the read request signal sent from the CPU.

5. A semiconductor integrated circuit according to claim 1, wherein the memory cell further comprises an SRAM memory cell.

* * * * *